(12) United States Patent
Perner

(10) Patent No.: US 7,057,961 B2
(45) Date of Patent: Jun. 6, 2006

(54) CIRCUIT AND METHOD FOR EVALUATING AND CONTROLLING A REFRESH RATE OF MEMORY CELLS OF A DYNAMIC MEMORY

(75) Inventor: Martin Perner, München (DE)

(73) Assignee: Infineon Technologies AG, Munich (DE)

( * ) Notice: Subject to any disclaimer, the term of this patent is extended or adjusted under 35 U.S.C. 154(b) by 100 days.

(21) Appl. No.: 10/920,206

(22) Filed: Aug. 18, 2004

(65) Prior Publication Data
US 2005/0041502 A1    Feb. 24, 2005

(30) Foreign Application Priority Data
Aug. 18, 2003  (DE)  ................ 103 37 855

(51) Int. Cl.
*G11C 7/00*  (2006.01)
(52) U.S. Cl. ........................... 365/222; 365/149
(58) Field of Classification Search ............... None
See application file for complete search history.

(56) References Cited

U.S. PATENT DOCUMENTS

| | | | | |
|---|---|---|---|---|
| 3,737,879 A | * | 6/1973 | Greene et al. | 365/222 |
| 4,625,301 A | * | 11/1986 | Berger | 365/222 |
| 4,628,488 A | * | 12/1986 | Saku et al. | 365/222 |
| 5,644,544 A | * | 7/1997 | Mizukami | 365/222 |
| 6,614,704 B1 | | 9/2003 | Dobler et al. | |
| 6,958,944 B1 | * | 10/2005 | Chou | 365/222 |

FOREIGN PATENT DOCUMENTS

| | | |
|---|---|---|
| JP | 02139794 A | 5/1990 |
| WO | WO 98/18130 A1 | 4/1998 |
| WO | WO 00/54159 A1 | 9/2000 |

OTHER PUBLICATIONS

Ralph Heinrich, et al., "Infineon technologies and Micron Technology Announce Cooperation to Develop 'Cellular-RAM'", HYB/E 25L256160AC 256-MBit Mobile-RAM, Jun. 24, 2002, 8 pages.
U.S. Patent Application No. 10/881,689.

* cited by examiner

*Primary Examiner*—Son Mai
(74) *Attorney, Agent, or Firm*—Edell, Shapiro & Finnan, LLC

(57) ABSTRACT

A circuit for controlling a refresh rate of memory cells of a dynamic memory includes a control circuit for controlling an access to memory cells of the dynamic memory. A memory circuit can be driven by the control circuit and stores a time information item with regard to an access to a memory cell assigned to the time information item. The control circuit can be operated in a supervisory operating mode such that a time information item is written to the memory circuit by the control circuit in the event of an access to the assigned memory cell. The time information item is read out in the event of a subsequent access to the assigned memory cell.

17 Claims, 5 Drawing Sheets

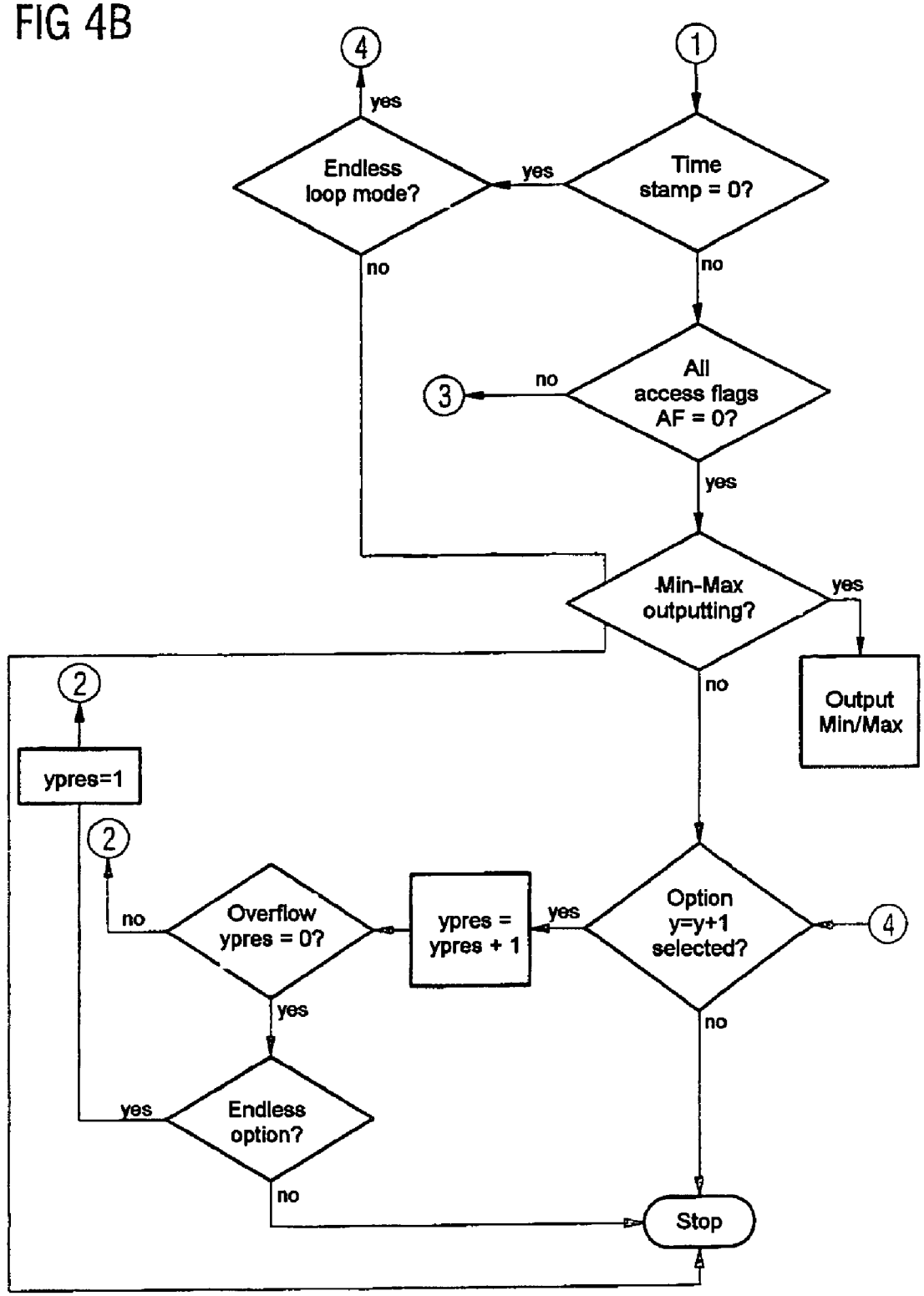

CIRCUIT AND METHOD FOR EVALUATING AND CONTROLLING A REFRESH RATE OF MEMORY CELLS OF A DYNAMIC MEMORY

CROSS REFERENCE TO RELATED APPLICATIONS

This application claims priority under 35 USC §119 to German Application No. DE 103 37855.3, filed on Aug. 18, 2003, and titled "Circuit and Method for Evaluating and Controlling a Refresh Rate of Memory Cells of a Dynamic Memory," the entire contents of which are hereby incorporated by reference.

FIELD OF THE INVENTION

The present invention relates to a circuit and a method for evaluating and controlling a refresh rate of memory cells of a dynamic memory.

BACKGROUND

In integrated dynamic memories such as DRAMs, a refresh operation is necessary during operations in which memory cells are not accessed external, in order to refresh the memory cell content, which can volatilize, for example, due to leakage currents of the storage capacitor or selection transistor, and thus to permanently retain the memory cell content. During the refresh operation, the assessed and amplified data signals from selected memory cells are written back directly to the relevant memory cells. This is generally controlled by a controller circuit, which defines a refresh frequency with which a respective refresh of the memory cell content is effected.

There are a number of possibilities for refreshing the content of memory cells. Firstly, during a normal operation of the memory for carrying out read or write operations, as early as with the activation of a word line of the memory and with the subsequent closing of the word line, the information read from the relevant memory cells is assessed and amplified in sense amplifiers. The assessed and amplified information is written back to the memory cells and refreshed in this way, i.e., normal activate-precharge cycle.

Furthermore, the memory controller sends auto-refresh commands to the memory, which in each case initiate a command sequence for activating a row due for refreshing. For example, a refresh counter defines which of the rows is due for refreshing. The refresh counter successively addresses the rows of the dynamic memory, for example, in a sequential sequence of their addresses. Such a refresh process is often effected in parallel in the memory banks of the memory such that a row is in each case activated and closed again simultaneously in each memory bank. If a memory bank has 4096 rows, for example, the memory controller that drives the memory sends an autorefresh command to the memory every 64 ms/4096 (the data retention time is 64 ms), for example.

For data retention, the memory may enter a self-refresh mode, in which a refresh counter periodically internally initiates a command sequence for activation and for closing of a row of the memory, similarly to an auto-refresh command described previously. The data of memory cells can thus be refreshed regularly even without an external auto-refresh command of a memory controller.

A memory controller, which controls access to the dynamic memory has the task, inter alia, of ensuring that none of the rows of the memory is in the non-activated state for longer than the maximum specified data retention time, for example 64 ms. In the simplest case, the memory controller intersperses an auto-refresh command between the normal read and write operations on average every 15.6 μs (=64 ms/4096). The term used in this case is distributed refreshes, which can be implemented only when the memory is not in a read or write mode.

With this type of distributed refresh, in particular, it is not possible to define when a distributed refresh is to be effected, since the points in time depend on the access capacity utilization. A high access capacity utilization during read and write operations of the memory would mean, however, that a multiplicity of rows are opened and closed again anyway during active operation, so that the information items are already refreshed during the customary read and write operations. In this case, the autorefresh commands are sent to the memory as a precaution in a regular sequence in a supporting manner, without knowing the actual refresh status.

SUMMARY

A circuit and a method for evaluating and controlling a refresh rate of memory cells of a dynamic memory can reduce the number and thus the frequency of the memory refreshes during operation of the memory in a data processing system.

A circuit for evaluating and controlling a refresh rate of memory cells of a dynamic memory according to the invention has a control circuit for controlling an access to memory cells of the dynamic memory, which can be operated in a plurality of operating modes. Furthermore, a memory circuit, which can be driven by the control circuit, for storing a time information item with regard to an access to a memory cell assigned to the time information item. The control circuit can be operated in a supervisory operating mode such that a time information item is written to the memory circuit by the control circuit in the event of an access to the assigned memory cell, which time information item is read out again in the event of a subsequent access to the assigned memory cell. The read-out time information item is fed to an evaluation circuit by which an evaluation information item with regard to the time duration between individual accesses to the assigned memory cell can be output externally of the memory. Thus, the invention provides a circuit for evaluating and controlling a refresh rate of memory cells of a dynamic memory with which it is possible, in a supervisory operating mode, for the refresh rate of the memory cells to be logged, supervised and corrected as required. The invention makes it possible to extend a dynamic memory by a supervisory operating mode which makes it possible, with the aid of a time information item, to ascertain when a memory cell was accessed the last time and whether the mean data retention time has been complied with.

According to the method according to the invention for evaluating and controlling a refresh rate of memory cells of a dynamic memory, a time information item with regard to an access to at least one of the memory cells is assigned thereto and stored in a memory circuit. In a supervisory operating mode of the memory, the time information item is stored in the event of an access to the assigned memory cell and is read out again in the event of a subsequent access to the assigned memory cell. The read-out time information item is fed to an external evaluation that yields an evaluation information item with regard to the time duration between individual accesses to the assigned memory cell.

The evaluation circuit for determining the evaluation information item, performs a comparison of the time information item stored in the memory circuit with a reference time information item. The evaluation circuit has a memory unit for storing individual values, in particular, extrema such as minima and maxima of a plurality of successively determined evaluation information items. The content of the memory unit can be output to outside the memory by the evaluation circuit. The evaluation circuit can be connected to data terminal pins of the dynamic memory for outputting the evaluation information item.

For writing the time information item to the memory circuit, for instance, the circuit preferably has a counter register connected to an oscillator, which increments or decrements the counter register with a defined clock rate. For writing in the time information item, the counter register is connected to the memory circuit. The evaluation information item is obtained in that, in the event of an access to one of the memory cells, the time information item is written to the memory circuit as a present counter reading of the counter register. When the time information item is read out, the time information item previously written in is compared with the present time that has advanced in the meantime. In other words, the counter reading written to the memory circuit is compared with the present counter reading of the counter register. In accordance with this embodiment, the reference time information item can be tapped off at the counter register for the comparison with the time information item stored in the memory circuit. After carrying out the comparison of the stored time information item with the present time information item, extrema from this comparison are stored in the memory unit of the evaluation circuit. The present minimum and maximum values are communicated, for instance, to a memory controller or to a test platform, for example, via data terminal pins of the dynamic memory.

To access memory cells of the dynamic memory, an activation command is generated for the selection and activation of a word line of the memory and a precharge command is generated for precharging the word line after the activation. A previously stored time information item of the assigned memory cell, which is selected with the activated word line, is read out by the activation command. A new time information item of the assigned memory cell is stored by of the precharge command.

The memory can be operated, for example, in a plurality of different operating modes for accessing memory cells of the memory. For example, the memory can be operated in the abovementioned normal activate-precharge cycle, in the autorefresh mode and in the self-refresh mode. In each of the operating modes, in each case, an activation command is generated for the selection and activation of a word line of the memory and a precharge command is generated for precharging the word line after the activation. In this case, there is selection from among the operating modes of that operating mode or those operating modes in which the supervisory operating mode of the memory is activated for the recording of the time information item.

A respective control bit, for example, in a dedicated memory area of the memory that is provided therefor, which control bit is set in a manner dependent on the respective time information item stored in the memory circuit and is read out in order to be able to ascertain whether a time information item has previously been written.

BRIEF DESCRIPTION OF THE FIGURES

The invention is explained in more detail below with reference to the figures which are illustrated in the drawing and illustrate exemplary embodiments with respect to the present invention.

FIGS. 4A and 4B show a flowchart of a second embodiment of an operating method for evaluating and controlling a refresh rate of memory cells of a dynamic memory.

DETAILED DESCRIPTION

Figure 1:
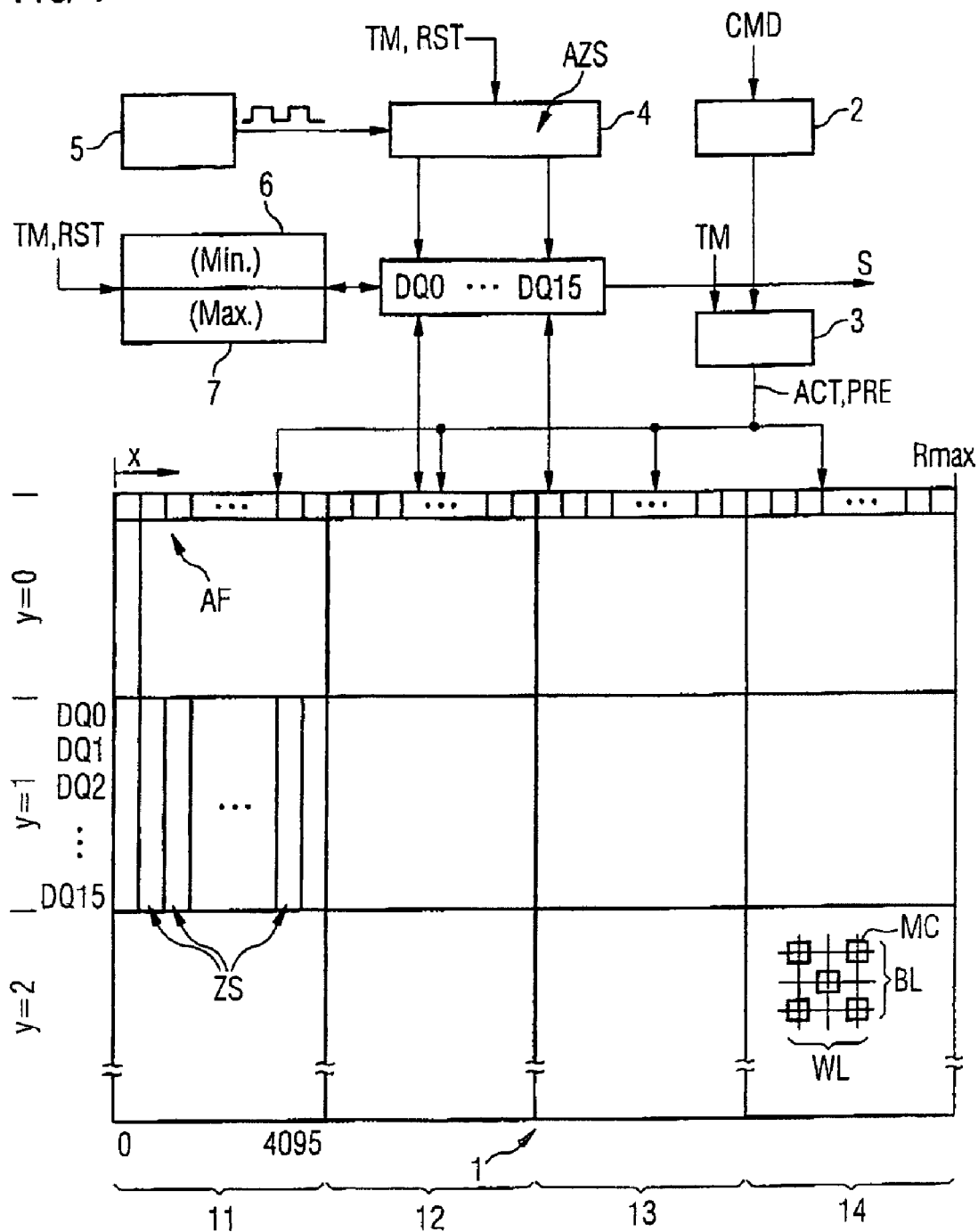
FIG. 1 shows an embodiment of a circuit for evaluating and controlling a refresh rate of memory cells of a dynamic memory.

FIG. 1 illustrates an embodiment of a circuit for evaluating and controlling a refresh rate of memory cells of a dynamic memory. The memory cell array 1 of the DRAM is subdivided into a plurality of memory banks 11 to 14 of identical type. The memory cells MC are arranged in the respective memory banks 11 to 14 along word lines WL (rows) and bit lines BL (columns). The memory cells MC are arranged at crossover points of the word lines and bit lines, and in each case include a storage capacitor and a selection transistor in the customary interconnection (which are not illustrated in FIG., for clarity). To select one of the memory cells MC, the respective selection transistor is turned on by an activated word line WL. The data signal of the selected memory cells MC along the word line can subsequently be assessed and amplified by a sense amplifier (also not illustrated in FIG. 1).

To refresh the memory cells, the data signals assessed and amplified by the respective sense amplifiers are written back to the relevant memory cells MC. In the refresh operation of the memory, a current consumption is necessary, in particular, as a result of the respectively required-activation of sense amplifiers, which current consumption correlates with the refresh frequency. In the interests of a minimum current consumption, therefore, the time duration between two refresh cycles should be as long as possible, so that the refresh frequency is as low as possible and the data retention time that is guaranteed by the manufacturer is utilized. In this case, the maximum achievable data retention time of the memory cells is crucial for determining the time duration required between two refresh cycles. It is influenced particularly by leakage currents in the storage capacitor and/or selection transistor, which increase with increasing memory temperatures.

In accordance with FIG. 1, command signals CMD for accessing memory cells, which are communicated by an external memory controller, for example, are received by a command decoder 2. In the event of direct access to the memory cell array 1, an access controller 3 generates an activation command ACT for the selection and activation of a word line WL of the memory and a precharge command PRE for precharging the word line after the activation. The access controller generates these signals from the received command signals CMD.

The access controller 3, which acts as a control circuit for controlling an access to memory cells of the dynamic memory, can be operated in a plurality of operating modes, in particular, in a normal operating mode and in a supervisory operating mode, which the access controller 3 enters on account of the test mode signal TM. According to the invention, in the supervisory operating mode of the memory, the access controller 3 causes a time information item in the form of a time stamp ZS to be stored in a memory circuit, here in an area of the memory cell array 1. For this purpose, the circuit in accordance with FIG. 1 has a counter register 4 in the form of a time counter that is connected to an oscillator 5. The oscillator 5 increments or decrements the time counter 4 with a defined clock rate. The present counter reading, i.e., the present time stamp AZS, is written to the relevant area of the memory cell 1 via the data terminal pins DQ0 to DQ15 of the DRAM. For this purpose, the time counter 4 is connected to the memory cell array 1 via the data terminal pins DQ0 to DQ15.

The memory banks 11 to 14 of the DRAM are, for example, subdivided into individual memory areas defined by different column groups y. For example, the time stamps ZS to be written are stored in a memory area of the memory banks 11 to 14 that is defined by the column group y=1. In this case, a time stamp ZS is stored in memory cells along a word line WL. The individual bits in each case are assigned to the individual data terminal pins DQ0 to DQ15, as illustrated in FIG. 1. The individual time stamps ZS are written to the memory cell array 1 with an ascending row address (x direction). This means, therefore, that when one of the word lines WL is accessed, the present time stamp AZS of the time counter 4 is stored in memory cells of the relevant word line WL in the form of the time stamp ZS, thereby storing a time information item with regard to an access to the word line. This time information item is read out in the event of a subsequent access to the relevant word line. The read-out time information item is fed to an evaluation circuit having memory units 6, 7 in which are stored individual extrema, for example, in the form of minima or maxima of a plurality of successively determined evaluation information items. The values stored in the memory units 6 and 7 can be output externally of the memory via the data terminal pins DQ0 to DQ15 by an output signal S. With the aid of a time stamp having a width of 16 bits, the refresh sequence of a DRAM test program can be monitored and influenced as required over a time duration of approximately 65 seconds.

Figure 2:
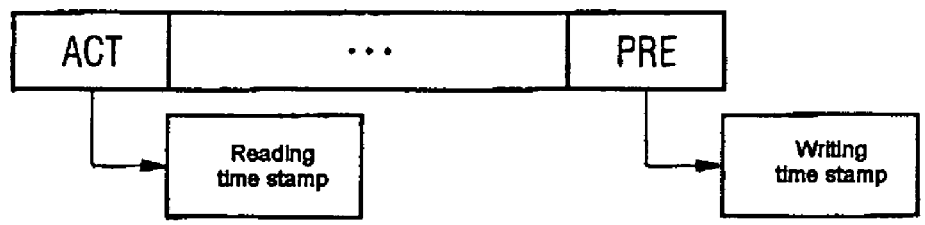
FIG. 2 shows exemplary command sequences for reading and writing a time information item.
Figure 2:
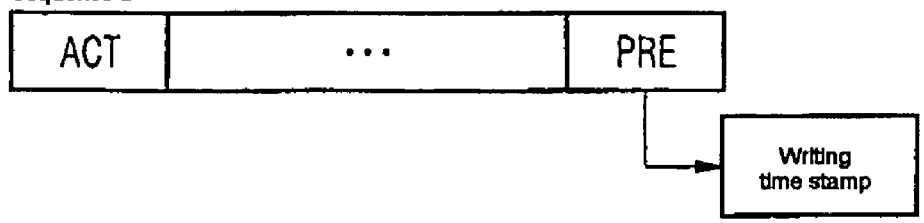

FIG. 2 shows exemplary command sequences for reading and writing a time stamp according to the invention. For access to one of the word lines of the memory, an activation command ACT with a row address is transferred, whereupon the corresponding memory row (word line) is activated by the access controller. The activation command ACT is communicated in the activate-precharge cycle, for example, by a memory controller connected externally to the memory, either for a targeted refresh process of the addressed memory row or for an access for reading out or writing data signals of the addressed memory row. In the latter case, in particular, a read or write operation is carried out after the activation command ACT. In the refresh case, by contrast, the memory is in a waiting state before the selected memory row is closed again and precharged by a subsequent precharge command PRE. In accordance with command sequence A, by the activation command ACT, the time stamp ZS is read out from the relevant memory row that is selected with the activation command ACT. By the precharge command PRE, a new time information item, the present time stamp AZS of the time counter 4 in accordance with FIG. 1, is written to the relevant memory row. In accordance with the command sequence B, the read-out of the time stamp with the activation of the activation command ACT is obviated.

Figure 3:
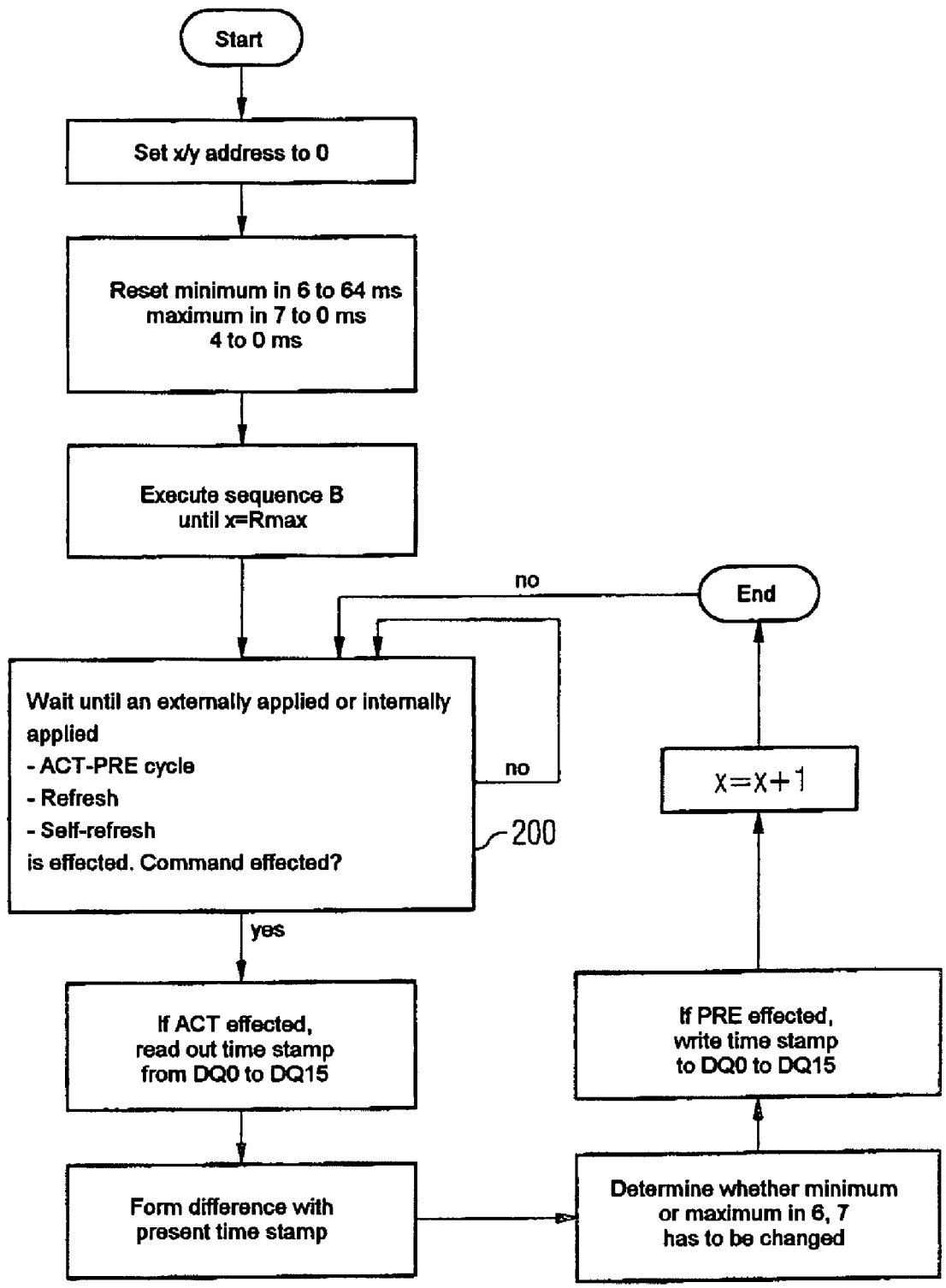
FIG. 3 shows a flowchart of a first embodiment of an operating method for evaluating and controlling a refresh rate of memory cells of a dynamic memory.

FIG. 3 shows a flowchart of a first embodiment of an operating method for evaluating and controlling a refresh rate of memory cells of a dynamic memory. First, the x/y address (row/column address) is reset to the value 0, for example. Furthermore, the minimum value in the memory unit 6 is set, for example, to 64 ms, and the maximum value in the memory unit 7 to 0 ms. Furthermore, the time counter 4 is reset to 0 ms. For this purpose, the memory units 6 and 7 and the time counter 4 can be reset to the relevant value by the reset signal RST and can be activated by the test mode signal TM for the supervisory operating mode. Afterward, the command sequence B from FIG. 2 is executed until a time stamp has been written to all the memory rows in an ascending x direction. In this case, the limit value marker Rmax is reached at the end of the memory bank 14. In this initialization operation of the memory, the relevant memory area (defined here by column group y=0) of the memory cell array 1 is preallocated a time information item before the circuit enters the supervisory operating mode.

In the supervisory operating mode of the circuit, in method step 200, a wait takes place until an externally applied or internally applied activate-precharge cycle, an external refresh command or a self-refresh mode is executed. In each of these operating modes for accessing the memory, an activation command ACT is generated for the selection and activation of a memory row of the memory and a precharge command PRE is generated for precharging the memory row after the activation. This method step enables selection from the operating modes of that operating mode or those operating modes, for example, one of the operating modes or logical combinations conceivable, in principle, in which the supervisory operating mode of the memory is activated for the recording of the respective time stamp. If one of the abovementioned events occurs, the command sequence A, in accordance with FIG. 2, is executed and the respective time stamp ZS is read out via the data terminal pins DQ0 to DQ15. The difference is then calculated with the present time stamp AZS as the reference time information item. Afterward, it is ascertained whether the difference formed falls below or exceeds the minimum value or maximum value, respectively, stored in the memory units 6 and 7. For this case, the difference formed is stored as a respective new value in the memory unit 6 or memory unit 7, depending on whether the minimum value or maximum value is affected. If the precharge command PRE is effected, the present time stamp AZS of the time counter 4 is written to the relevant memory row again via the data terminal pins DQ0 to DQ15. Afterward, the row address is increased by 1 and the method sequence is continued from method step 200, as described above, i.e., the time information is written in and read out again for each of the addressed memory rows, until the end is reached.

Figure 4A:
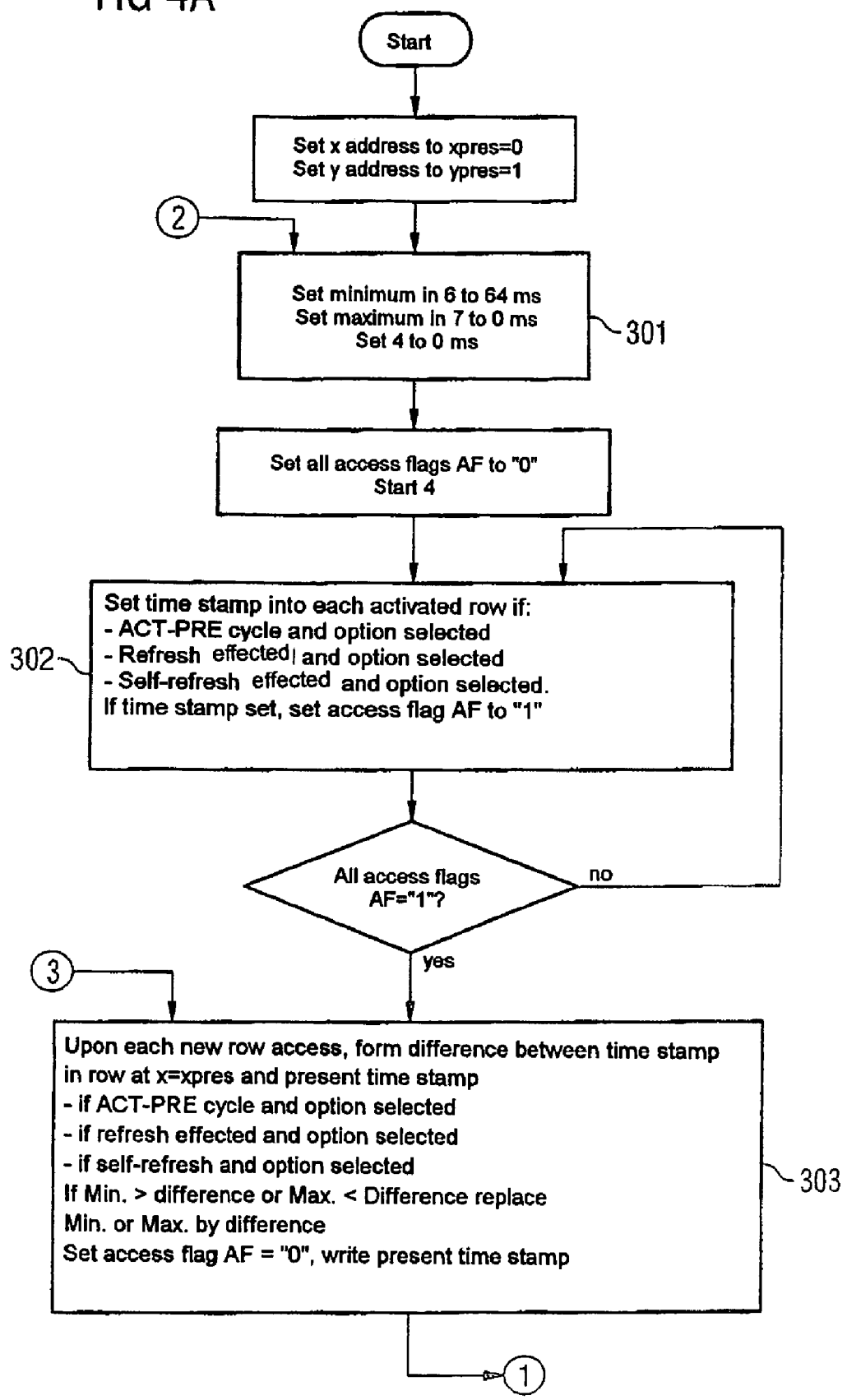

FIG. 4A show a flowchart of a further embodiment of an operating method for evaluating and controlling a refresh rate of memory cells of a dynamic memory. Firstly, in accordance with FIG. 4A, the x address of the present memory row is set to xpres=0. The y address of the present column group is set to ypres=1. In this case, time information items are subsequently written to the column group y=1, as illustrated in FIG. 1. In a manner analogous to that in the method according to FIG. 3, the minimum value in the memory unit 6 is set, for example, to 64 ms, and the maximum value in the memory unit 7 to 0 ms. The time counter 4 is likewise decreased to the value 0 ms (method step 301). In contrast to the method according to FIG. 3, in the method in accordance with FIG. 4, in a memory area of the memory cell array that is provided for this, a control bit AF is set in a manner dependent on the respective time information stored and is read out in order to ascertain whether a time information item has previously been written. The memory cell array 1 in accordance with FIG. 1 has a memory area provided for this, defined by the column group y=0, to store the control bit AF for the respectively assigned memory row. In this case, the control bits AF, i.e., access flags, are set to the value "0." At the same time, the time counter 4 is started and driven by the oscillator 5 with a specific clock rate, one clock period, for example, identifying the time range of 1 ms.

In a manner analogous to that in the operating method according to FIG. 3, a time stamp ZS is set depending on the respective operating mode, i.e., is written to the relevant memory row when the corresponding option is selected in the relevant operating mode. The command sequence B in accordance with FIG. 2 is executed and, if the time stamp is set, the relevant access flag AF is set to the value "1." In this case, the time stamps are written to a memory area of the memory cell array 1 in accordance with FIG. 1 which is defined by the column group y=1. The respective time stamps are thus stored in memory cells which are arranged in the memory area of the column group y=1 along an addressable memory row of the memory (method step 302). This method step is repeated until the access flags AF are set to the value "1."

The command sequence A in accordance with FIG. 2 is subsequently executed, the difference between the written time stamp ZS in the row at x=xpres and the present time stamp AZS of the time counter 4 being formed upon each new row access. In accordance with the preceding method step 302 relating to the setting of the time stamp, the difference formation also takes account of those operating modes for accessing memory cells of the memory for which the option is selected. If the minimum value stored in the memory unit 6 is greater than the difference value or the maximum value stored in the memory unit 7 is less than the difference value, the minimum value or maximum value is replaced by the difference value. Afterward, the access flag AF is set to the value "0" (thus changes alternately between "1" and "0") and the present time stamp is written from the time counter 4 to the relevant row. After the end of this method step 303, the memory units 6 and 7 thus store respective extrema Min, Max determined from a totality of a plurality of time stamps with regard to a plurality of memory rows.

In the next method step (FIG. 4B), a check is made to determine whether the respective time stamps have the value "0." If this is yes, an error case is present, which involves a modified procedure. For the case where an endless loop is not intended, if appropriate, the respective minimum and maximum values are output and then the operating method is ended. For the case where the endless loop mode is selected, for a new attempt, a new column group y=y+1 is selected for a renewed pass (this will be explained in more detail below).

For the case of a proper function (time stamp≠0), a check is made to determine whether the access flags AF have the value "0". For the case where this is not true, the writing of a time stamp to memory rows is continued (method step 303 in accordance with FIG. 4A). Otherwise, an interrogation is effected to determine whether the minimum value and/or maximum value are/is to be output. If yes, the corresponding values are output; if no, a next method step effects an interrogation to determine whether corresponding time information is to be written to a new column group y=y+1 of the memory cell array. If not, the method is ended. Otherwise, the address of the column group is correspondingly increased, so that the present column group ypres=ypres+1. In the example according to FIG. 1, after writing to the column group y=1, upon reaching the limit value marker Rmax, corresponding time stamps are thus written to the next higher column group y=2.

For the case where an overflow is not ascertained, i.e., the operating method is continued with the resetting of the memory units 6 and 7 and of the time counter 4, as described above, in the new column group (method step 301). The individual subsequent method steps as already described above with regard to writing to the column group y=1 are then effected. For the case where an overflow ypres=0 is ascertained, the method is subsequently ended in the case where the endless option is not selected. Otherwise, the present column group is set to ypres=1 for renewed writing of time information items and the method is continued for a new beginning with the resetting of the memory units 6 and 7 and of the time counter 4 (method step 301), as described above.

Thus, in the operating case where the endless loop option is selected, the word lines in one of the memory areas are selected serially with an ascending row address until a memory row is reached at the set marker Rmax of the relevant memory area. Afterward, the serial selection of memory rows is continued within a further, different memory area until this mode is ended. In this case, test modes are able to initialize the "refresh monitoring" and then to restart, to interrupt, to continue or to end it. The supervisory parameters Min and Max may also be output permanently via the data terminal pins DQ or upon call-up by a test mode after termination of the generation of the time stamps.

Figure 5:
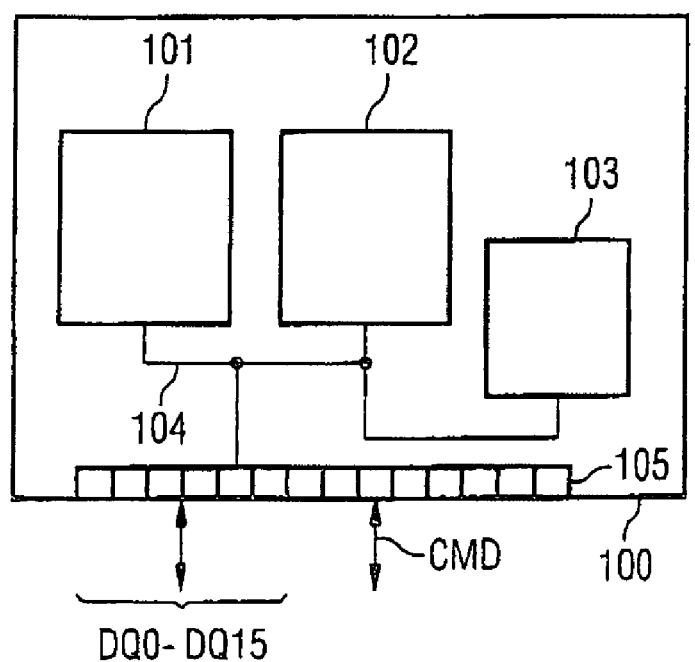
FIG. 5 shows an embodiment of a module arrangement with a supervisory chip on which a circuit according to the invention for evaluating and controlling a refresh rate of memory cells is arranged.

FIG. 5 illustrates an embodiment of a module arrangement with a supervisory chip on which a circuit according to the invention for evaluating and controlling a refresh rate of memory cells is arranged. The memory module arrangement 100 has a plurality of memory chips 101 and 103. Data are read into the memory chips 101 and 102, and read out again, via the terminal array 105 and the signal and data path 104 in a normal operating mode. Accordingly, for this purpose, the command signals CMD are applied to the memory module arrangement 100 and data are transferred via the data terminal pins DQ0 to DQ15. The memory chip 103, by contrast, is designed as a supervisory chip and switched into the signal and data path 104 of the remaining memory chips 101, 102 in order to control their refresh rate of memory cells. The memory chip 103 is thus used as a "refresh controller" for the other memory chips 101, 102. A prerequisite for this is that the memory chips 101, 102, 103 are constructed identically in particular with regard to the memory cell array.

For permanent configuration of the memory chip 103, it is possible to employ customary production measures such as the installation of a bonding option or the electrical or optical programming of fuses (contact bridges). If the memory chip 103 is configured as a "refresh controller", the read and write commands sent to the memory chip are suppressed. The chip can no longer be externally written to or read. A test mode sent via special pins or address pins can pass over the fixedly programmed hardware presetting. Thus, supervision of customer returns and applications with regard to complying with the data retention time is possible.

The circuit according to the invention for evaluating and controlling a refresh rate of memory cells may be integrated as hardware completely or partially on a memory chip itself, or else completely or partially in a memory controller, which for example generates autorefresh commands or initiates targeted activate-precharge cycles.

The above description of the exemplary embodiments in line with the present invention serves merely for illustrative purposes and not to limit the invention. The invention allows various changes and modifications without departing from the scope of the invention and its equivalents.

LIST OF REFERENCE SYMBOLS

1 Memory cell array
2 Command decoder
3 Access controller
4 Time counter
5 Oscillator
6, 7 Memory unit
11 to 14 Memory bank
WL Word line (row)
BL Bit line (column)
MC Memory cells
DQ0 to DQ15 Data terminal pins
ACT Activation command
PRE Precharge command
CMD Command signals
ZS Time stamp
AZS Present time stamp
TM Test mode signal
RST Reset signal
x Row
y Column group
Rmax Limit value marker
AF Control bit (access flag)
S Output signal
Min Minimum value
Max Maximum value
A, B Command sequence
100 Memory module arrangement
101 to 103 Memory chip
104 Signal and data path
105 Terminal array
200 Method step
301 to 303 Method step

I claim:

1. A circuit for evaluating and controlling a refresh rate of memory cells of a dynamic memory, comprising:
    a control circuit for controlling access to memory cells of the dynamic memory, the dynamic memory operating in a plurality of operating modes; and
    a memory circuit, the memory circuit being driven by the control circuit, the memory circuit storing a time information item with regard to an access to a memory cell assigned to the time information item,
    wherein, in the event of an access to the assigned memory cell, the control circuit operating in a supervisory operating mode such that a time information item is written to the memory circuit by the control circuit,
    the time information item being read out in the event of a subsequent access to the assigned memory cell,
    the read-out time information item being transferred to an evaluation circuit, and an evaluation information item with regard to the time duration between individual accesses to the assigned memory cell being output from the memory.

2. The circuit as claimed in claim 1, wherein
    the evaluation circuit for determining the evaluation information item performs a comparison of the time information item stored in the memory circuit with a reference time information item and calculates a difference therefrom, the evaluation circuit having a memory unit for storing individual values of a plurality of successively determined evaluation information items, and
    the evaluation circuit designed to output the content of the memory unit to outside the memory.

3. The circuit as claimed in claim 2, wherein the evaluation circuit can be connected to data terminal pins of the dynamic memory.

4. The circuit as claimed in claim 1, wherein the circuit has a counter register and an oscillator, the oscillator being connected to the counter register, the oscillator incrementing or decrementing the counter register with a defined clock rate, the counter register being connected to the memory circuit for writing in the time information item.

5. The circuit as claimed in claim 4, wherein a reference time information item can be tapped off at the counter register for comparison with the time information item stored in the memory circuit.

6. The circuit as claimed in claim 4, wherein the counter register can be set or reset by an operating mode signal.

7. The circuit as claimed in claim 1, wherein the memory circuit is formed by memory cells arranged in a memory area along an addressable word line of the dynamic memory.

8. The circuit as claimed in claim 1, wherein the memory circuit has a memory area for storing a control bit, the control bit being set depending on the stored time information item and can be read out by the control circuit.

9. The circuit as claimed in claim 1, wherein the circuit is arranged on one of a plurality of memory chips, the plurality of memory chips forming a memory module arrangement, one of the memory chips being connected into a signal and data path of the rest of the memory chips in order to evaluate and control the refresh rate of memory cells.

10. A method for evaluating and controlling a refresh rate of memory cells of a dynamic memory, the method comprising:
    assigning a time information item with regard to an access to at least one of the memory cells to a memory circuit;
    in a supervisory operating mode of the memory, storing the time information item in the event of an access to the assigned memory cell and reading out the time information item in the event of a subsequent access to the assigned memory cell; and
    feeding the read-out time information item to an external evaluation that yields an evaluation information item with regard to the time duration between individual accesses to the assigned memory cell.

11. The method as claimed in claim 10, wherein individual extrema are determined from a totality of a plurality of evaluation information items with regard to a plurality of memory cells.

12. The method as claimed in claim 11, wherein the dynamic memory has a plurality of word lines and at least one memory area in which a plurality of the word lines are arranged, a plurality of the memory cells in each case being selectable by the word lines, the memory cells being accessed in units of word lines by a serial selection of word lines within the memory area, individual accesses and corresponding evaluations being carried out until a word line is reached at a set marker of the memory area.

13. The method as claimed in claim 12, wherein, when a word line reaches the set marker of the memory area, a serial selection of word lines is effected within a further, different memory area.

14. The method as claimed in claim 10, wherein for accessing memory cells of the dynamic memory, an activation command is generated for the selection and activation of a word line of the memory and a precharge command is generated for precharging the word line after the activation, reading out a stored time information item of the assigned memory cell, selected with the activated word line by the activation command, and storing a new time information item of the assigned memory cell by the precharge command.

15. The method as claimed in claim 10, wherein in a plurality of different operating modes for accessing memory cells of the memory, an activation command is generated for selection and activation of a word line of the memory and a precharge command is generated for precharging the word line after the activation, and a selection is made in respect of that one of the operating modes in which the supervisory operating mode of the memory is activated for recording the time information item.

16. The method as claimed in claim 10, wherein, in an initialization operation of the memory, preallocating a value for the memory circuit or parts thereof before the circuit enters into the supervisory operating mode.

17. The method as claimed in claim 10, wherein a control bit is set depending on the respective time information item stored in the memory circuit and is read out to ascertain whether a time information item has previously been written.

* * * * *